(12) United States Patent
Wang

(10) Patent No.: US 8,568,175 B1
(45) Date of Patent: Oct. 29, 2013

(54) POWER PLUG HAVING A TERMINAL WITH SOLDERING ARMS CLAMPING A SOLDERING TAIL OF ANOTHER TERMINAL

(75) Inventor: Chin-Chou Wang, New Taipei (TW)

(73) Assignee: Cheng UEI Precision Industry Co., Ltd., New Taipei (TW)

( * ) Notice: Subject to any disclaimer, the term of this patent is extended or adjusted under 35 U.S.C. 154(b) by 23 days.

(21) Appl. No.: 13/443,870

(22) Filed: Apr. 10, 2012

(51) Int. Cl.
*H01R 24/00* (2011.01)

(52) U.S. Cl.
USPC .......................................................... 439/675

(58) Field of Classification Search
USPC ...................................... 439/674–679, 63, 68
See application file for complete search history.

(56) References Cited

U.S. PATENT DOCUMENTS

| | | | |
|---|---|---|---|
| 7,108,514 B2 * | 9/2006 | Chen et al. .................. | 439/63 |
| 7,938,678 B1 * | 5/2011 | Lee et al. ................... | 439/541.5 |
| 8,192,206 B1 * | 6/2012 | Ju .............................. | 439/66 |
| 8,337,254 B2 * | 12/2012 | Jin ............................. | 439/675 |
| 2011/0143603 A1 * | 6/2011 | Huang et al. .............. | 439/675 |
| 2012/0309237 A1 * | 12/2012 | Marzano et al. .......... | 439/675 |

* cited by examiner

*Primary Examiner* — Chandrika Prasad
(74) *Attorney, Agent, or Firm* — Cheng-Ju Chiang

(57) ABSTRACT

A power plug includes a base body having a mating pillar, a first electrical terminal which has a connecting board and two first contact arms extending upward from two ends of a top edge of the connecting board and inclined toward each other, a second electrical terminal which has a connecting portion and two second contact arms extending upward from two ends of a top of the connecting portion and inclined toward each other, and a sleeve terminal having a contact sleeve put around the mating pillar. The first electrical terminal and the second electrical terminal are crosswise assembled in the mating pillar to make the first contact arms and the second contact arms provide elastic clamping forces from four directions. So, it effectively increases insertion and extraction forces between the power plug and a mating socket, and further prolongs the useful life of the power plug.

9 Claims, 4 Drawing Sheets

POWER PLUG HAVING A TERMINAL WITH SOLDERING ARMS CLAMPING A SOLDERING TAIL OF ANOTHER TERMINAL

BACKGROUND OF THE INVENTION

1. Field of the Invention

The present invention relates to a plug, and more particularly to a power plug.

2. The Related Art

Referring to FIG. 1 and FIG. 2, a conventional power plug is shown. The power plug includes a base body 10', an electrical terminal 20', a sleeve terminal 30' and a connecting body 40'. The base body 10' has a columned mating pillar 11' of which a front is concaved rearward to form a mating hole 111' and a pair of receiving fillisters 112'. The receiving fillisters 112' are located at two sides of the mating hole 111' and communicated with the mating hole 111'. The electrical terminal 20' has a soldering plate 21' and a pair of contact arms 22' slantwise extending forward from two ends of a front edge of the soldering plate 21'. The contact arms 22' are received in the receiving fillisters 112' with front ends thereof projecting into the mating hole 111', and the soldering plate 21' penetrates rearward through a rear of the mating pillar 11' to project out of the base body 10'. The sleeve terminal 30' is of a cylindraceous shape and put around the mating pillar 11'. Then mold the connecting body 40' around rears of the mating pillar 11' and the sleeve terminal 30'.

However, the foregoing power plug utilizes single electrical terminal 20' to electrically contact with a mating socket (not shown). The contact arms 22' of the electrical terminal 20' provide elastic clamping forces only from two directions. As a result, the elastic clamping forces of the contact arms 22' easily become weaker and weaker after repeatedly inserting and extracting the power plug for many times. That further shortens the useful life of the power plug.

SUMMARY OF THE INVENTION

Accordingly, an object of the present invention is to provide a power plug including a base body, a first electrical terminal, a second electrical terminal and a sleeve terminal. The base body has a columned mating pillar placed vertically. A top of the mating pillar is concaved downward to form a mating hole, a pair of first receiving fillisters and a pair of second receiving fillisters alternately located around the mating hole and communicating with the mating hole. The first receiving fillisters and the second receiving fillisters are respectively aligned along a radial direction of the mating hole. The first receiving fillisters and the second receiving fillisters further penetrate downward through the mating pillar to form a rectangular first through slot and a rectangular second through slot which cross each other and connect with each other. The first electrical terminal has a connecting board, a soldering tail protruding downward from a middle of a bottom edge of the connecting board, and a pair of first contact arms extending upward from two ends of a top edge of the connecting board and inclined toward each other in process of extending upward. The connecting board is inserted in the first through slot of the base body with the soldering tail projecting out under the mating pillar and the first contact arms being received in the first receiving fillisters. The second electrical terminal has a connecting portion, a pair of soldering arms extending downward from two ends of a bottom of the connecting portion, and a pair of second contact arms extending upward from two ends of a top of the connecting portion and inclined toward each other in process of extending upward. The connecting portion is located in the second through slot of the base body with the soldering arms partly projecting out under the mating pillar and the second contact arms being received in the second receiving fillisters. The soldering tail of the first electrical terminal is clamped between the soldering arms of the second electrical terminal. The sleeve terminal has a cylindraceous contact sleeve put around the mating pillar of the base body. At least one soldering foot protrudes downward from a bottom edge of the contact sleeve and further partly projects under the mating pillar of the base body.

As described above, the first electrical terminal and the second electrical terminal are crosswise assembled in the mating pillar of the base body to make the first contact arms and the second contact arms provide elastic clamping forces from four directions. So, it effectively increases insertion and extraction forces between the power plug and a mating socket (not shown), and further prolongs the useful life of the power plug.

BRIEF DESCRIPTION OF THE DRAWINGS

The present invention will be apparent to those skilled in the art by reading the following description thereof, with reference to the attached drawings, in which.

DETAILED DESCRIPTION OF THE EMBODIMENT

Figure 1:
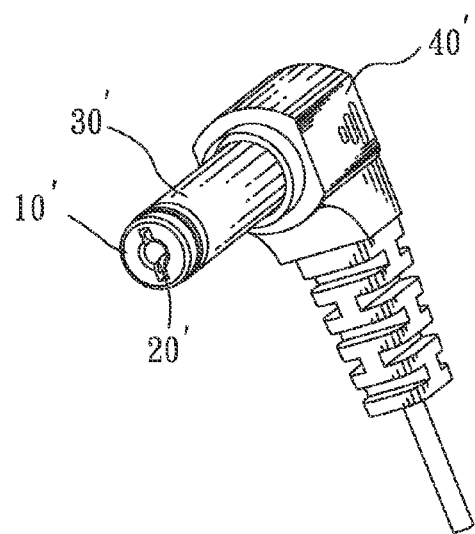
FIG. 1 is an assembled perspective view of a conventional power plug.
Figure 2:
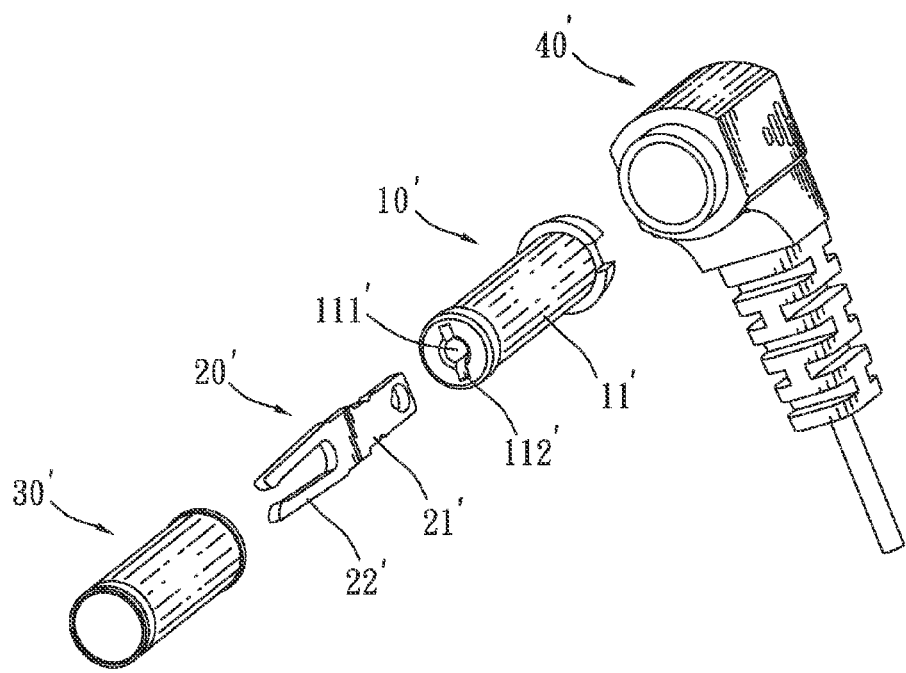
FIG. 2 is an exploded perspective view of the conventional power plug of FIG. 1.
Figure 3:
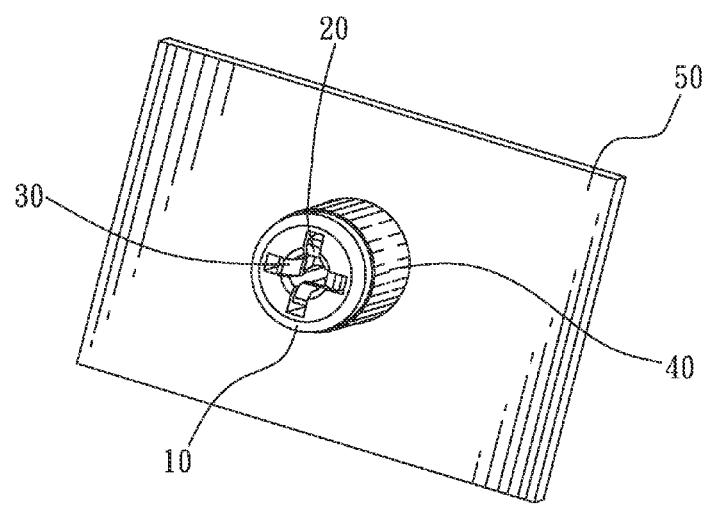
FIG. 3 is an assembled perspective view of a power plug according to an embodiment of the present invention.
Figure 7:
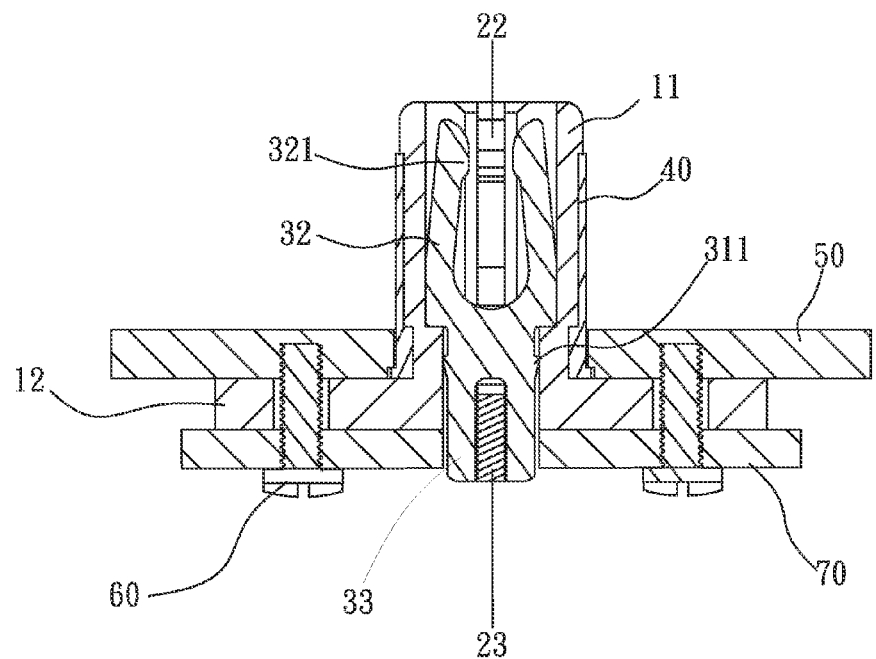
FIG. 7 is a cross-sectional view showing that the power plug of FIG. 6 is connected with a circuit board.

Referring to FIG. 3 and FIG. 7, a power plug according to an embodiment of the present invention is adapted for connecting with a circuit board 70 by means of a SMT process. The power plug includes a base body 10, a first electrical terminal 20, a second electrical terminal 30 and a sleeve terminal 40.

Figure 4:
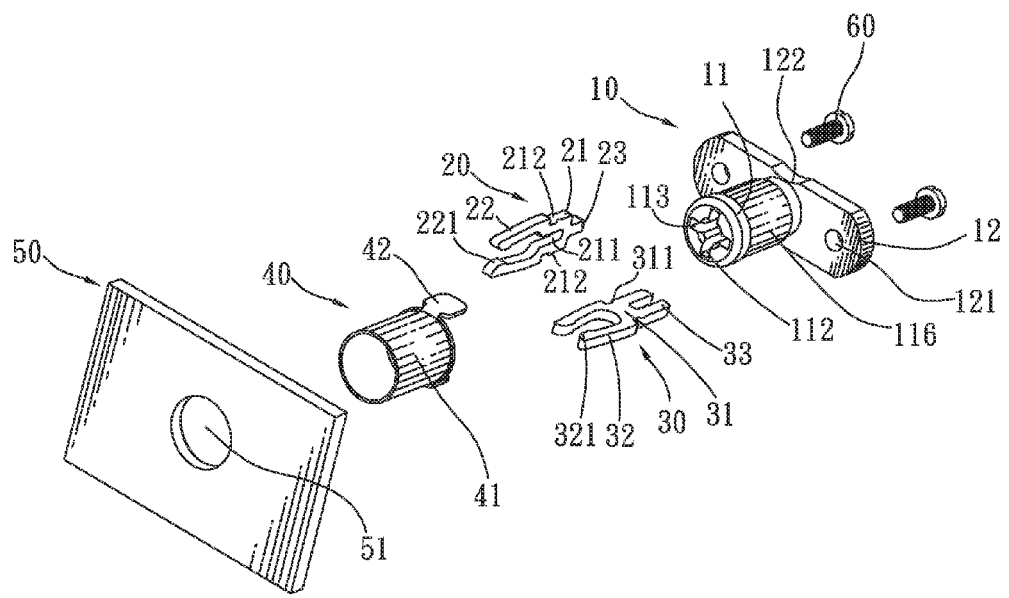
FIG. 4 is an exploded perspective view of the power plug of FIG. 3.
Figure 5:
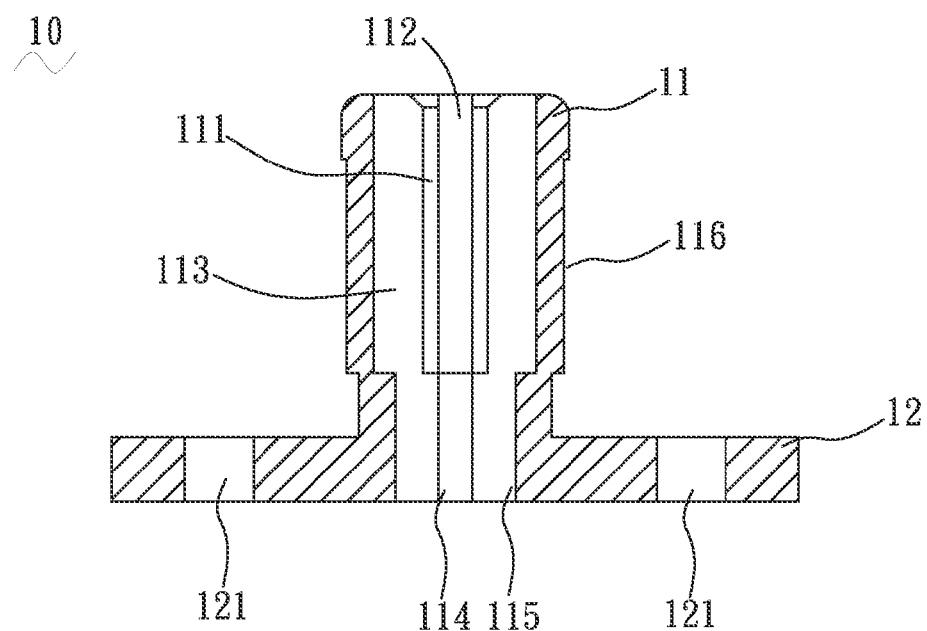
FIG. 5 is a cross-sectional view of a base body of the power plug of FIG. 4.

Referring to FIG. 4 and FIG. 5, the base body 10 has a columned mating pillar 11 placed vertically. A top of the mating pillar 11 is concaved downward to form a mating hole 111, a pair of first receiving fillisters 112 and a pair of second receiving fillisters 113 alternately located around the mating hole 111 and communicating with the mating hole 111. The first receiving fillisters 112 and the second receiving fillisters 113 are respectively aligned along a radial direction of the mating hole 111. In this embodiment, the first receiving fillisters 112 are aligned along one radial direction of the mating hole 111 perpendicular to another radial direction of the mating hole 111 along which the second receiving fillisters 113 are aligned. The first receiving fillisters 112 and the second receiving fillisters 113 further penetrate downward through the mating pillar 11 to form a rectangular first through slot 114 and a rectangular second through slot 115 which cross each other and connect with each other.

Figure 6:
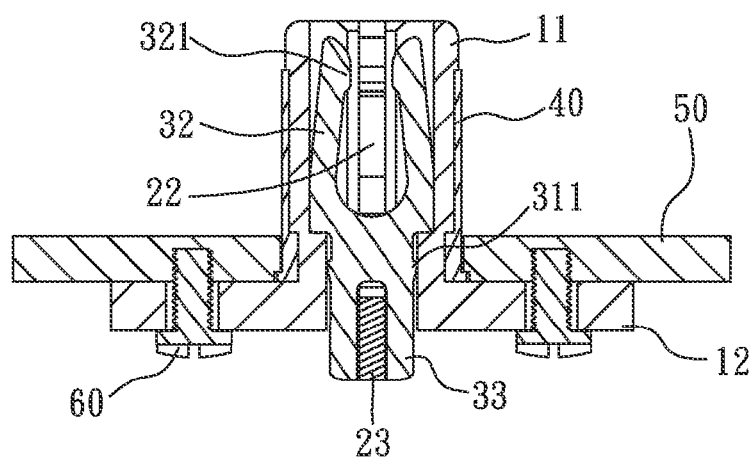
FIG. 6 is a cross-sectional view of the power plug of FIG. 3.

Referring to FIG. 4 and FIG. 6, the first electrical terminal 20 has a connecting board 21, a soldering tail 23 protruding downward from a middle of a bottom edge of the connecting board 21, and a pair of first contact arms 22 extending upward from two ends of a top edge of the connecting board 21 and inclined toward each other in process of extending upward. The connecting board 21 is inserted in the first through slot 114 of the base body 10 with the soldering tail 23 projecting out under the mating pillar 11 and the first contact arms 22 being received in the first receiving fillisters 112. The second electrical terminal 30 has a connecting portion 31, a pair of soldering arms 33 extending downward from two ends of a bottom of the connecting portion 31, and a pair of second contact arms 32 extending upward from two ends of a top of the connecting portion 31 and inclined toward each other in process of extending upward. The connecting portion 31 is located in the second through slot 115 of the base body 10 with the soldering arms 33 partly projecting out under the mating pillar 11 and the second contact arms 32 being received in the second receiving fillisters 113. The soldering tail 23 of the first electrical terminal 20 is clamped between the soldering arms 33 of the second electrical terminal 30.

A middle of the top edge of the connecting board 21 of the first electrical terminal 20 is concaved downward to form a positioning slot 211 for positioning the connecting portion 31 of the second electrical terminal 30 therein. Two side edges of the connecting board 21 and two side edges of the connecting portion 31 protrude outward to form a plurality of barbs 212, 311 resisting against inner sides of the first through slot 114 and the second through slot 115 of the base body 10. Top ends of the first contact arms 22 and top ends of the second contact arms 32 protrude inward and slope downward to form a pair of first guiding slopes 221 and a pair of second guiding slopes 321 of which all project into the mating hole 111 of the base body 10.

Referring to FIGS. 4-6, the sleeve terminal 40 has a cylindraceous contact sleeve 41 put around the mating pillar 11 of the base body 10. A pair of soldering feet 42 protrudes downward from a bottom edge of the contact sleeve 41 and is located along a radial direction of the contact sleeve 41. A bottom of the mating pillar 11 of the base body 10 oppositely extends outward along a radial direction of the mating pillar 11 to form a pair of propping flanks 12 with a pair of positioning gaps 122 forming at the joints thereof for positioning the corresponding soldering feet 42 of the sleeve terminal 40 therein. The soldering feet 42 further partly project under the mating pillar 11 of the base body 10. An outer periphery of the mating pillar 11 of the base body 10 is concaved inward to form a cylindraceous restraining groove 116 for restraining the contact sleeve 41 of the sleeve terminal 40 therein.

Referring to FIGS. 4-6 again, each propping flank 12 of the base body 10 defines at least one fastening aperture 121 vertically penetrating therethrough. The power plug further includes a fastening member 50 of flat board shape and at least two fastening elements 60. The fastening member 50 defines an assembling hole 51 through which the mating pillar 11 of the base body 10 together with the contact sleeve 41 of the sleeve terminal 40 passes to make the fastening member 50 abut on the propping flanks 12. Then the fastening elements 60 pass upward through the fastening apertures 121 to fix the fastening member 50 and the propping flanks 12 together. In this embodiment, the fastening element 60 is a screw.

Referring to FIG. 7, when the power plug is connected with the circuit board 70 by the SMT process, the circuit board 70 abuts under the base body 10 with the soldering tail 23 of the first electrical terminal 20, the soldering arms 33 of the second electrical terminal 30 and the soldering feet 42 of the sleeve terminal 40 being inserted in the circuit board 70 and soldered with the circuit board 70. The fastening elements 60 successively pass through the circuit board 70 and the corresponding fastening apertures 121 of the propping flanks 12 to fasten the circuit board 70 and the power plug together.

As described above, the first electrical terminal 20 and the second electrical terminal 30 are crosswise assembled in the mating pillar 11 of the base body 10 to make the first contact arms 22 and the second contact arms 32 provide elastic clamping forces from four directions. So, it effectively increases insertion and extraction forces between the power plug and a mating socket (not shown), and further prolongs the useful life of the power plug.

What is claimed is:

1. A power plug, comprising:
   a base body having a columned mating pillar placed vertically, a top of the mating pillar being concaved downward to form a mating hole, a pair of first receiving fillisters and a pair of second receiving fillisters alternately located around the mating hole and communicating with the mating hole, the first receiving fillisters and the second receiving fillisters being respectively aligned along a radial direction of the mating hole, the first receiving fillisters and the second receiving fillisters further penetrating downward through the mating pillar to form a rectangular first through slot and a rectangular second through slot which cross each other and connect with each other;
   a first electrical terminal having a connecting board, a soldering tail protruding downward from a middle of a bottom edge of the connecting board, and a pair of first contact arms extending upward from two ends of a top edge of the connecting board and inclined toward each other in process of extending upward, the connecting board being inserted in the first through slot of the base body with the soldering tail projecting out under the mating pillar and the first contact arms being received in the first receiving fillisters;
   a second electrical terminal having a connecting portion, a pair of soldering arms extending downward from two ends of a bottom of the connecting portion, and a pair of second contact arms extending upward from two ends of a top of the connecting portion and inclined toward each other in process of extending upward, the connecting portion being located in the second through slot of the base body with the soldering arms partly projecting out under the mating pillar and the second contact arms being received in the second receiving fillisters, the soldering tail of the first electrical terminal being clamped between the soldering arms of the second electrical terminal; and
   a sleeve terminal having a cylindraceous contact sleeve put around the mating pillar of the base body, at least one soldering foot protruding downward from a bottom edge of the contact sleeve and further partly projecting under the mating pillar of the base body.

2. The power plug as claimed in claim 1, wherein a middle of the top edge of the connecting board of the first electrical terminal is concaved downward to form a positioning slot for positioning the connecting portion of the second electrical terminal therein.

3. The power plug as claimed in claim 2, wherein two side edges of the connecting board and two side edges of the connecting portion protrude outward to form a plurality of barbs resisting against inner sides of the first through slot and the second through slot.

4. The power plug as claimed in claim 1, wherein top ends of the first contact arms and top ends of the second contact arms protrude inward and slope downward to form a pair of first guiding slopes and a pair of second guiding slopes of which all project into the mating hole of the base body.

5. The power plug as claimed in claim 1, wherein the first receiving fillisters of the base body are aligned along one radial direction of the mating hole perpendicular to another radial direction of the mating hole along which the second receiving fillisters are aligned.

6. The power plug as claimed in claim 1, wherein the soldering foot of the sleeve terminal has two located along a radial direction of the contact sleeve, a bottom of the mating pillar of the base body oppositely extends outward along a radial direction of the mating pillar to form a pair of propping flanks with a pair of positioning gaps forming at the joints thereof for positioning the corresponding soldering feet of the sleeve terminal therein.

7. The power plug as claimed in claim 6, wherein each propping flank of the base body defines at least one fastening aperture vertically penetrating therethrough, the power plug further includes a fastening member of flat board shape and at least two fastening elements, the fastening member defines an assembling hole through which the mating pillar of the base body together with the contact sleeve of the sleeve terminal passes to make the fastening member abut on the propping flanks, then the fastening elements pass upward through the fastening apertures to fix the fastening member and the propping flanks together.

8. The power plug as claimed in claim 7, wherein the fastening element is a screw.

9. The power plug as claimed in claim 1, wherein an outer periphery of the mating pillar of the base body is concaved inward to form a cylindraceous restraining groove for restraining the contact sleeve of the sleeve terminal therein.

* * * * *